United States Patent
Akaogi et al.

(10) Patent No.: US 7,260,014 B1
(45) Date of Patent: Aug. 21, 2007

(54) VOLTAGE SUPPLY CIRCUIT FOR MEMORY ARRAY PROGRAMMING

(75) Inventors: Takao Akaogi, Cupertino, CA (US); Nian Yang, Mountain View, CA (US)

(73) Assignee: Spansion LLC, Sunnyvale, CA (US)

(*) Notice: Subject to any disclaimer, the term of this patent is extended or adjusted under 35 U.S.C. 154(b) by 60 days.

(21) Appl. No.: 11/250,913

(22) Filed: Oct. 14, 2005

(51) Int. Cl.
*G11C 5/14* (2006.01)
(52) U.S. Cl. ............... 365/226; 365/189.11; 365/156
(58) Field of Classification Search ........... 365/226, 365/189.11, 156, 189.09, 149, 104
See application file for complete search history.

(56) References Cited

U.S. PATENT DOCUMENTS

| | | | | |
|---|---|---|---|---|
| 5,963,061 A * | 10/1999 | Briner | ........................ | 327/55 |
| 6,208,200 B1 * | 3/2001 | Arakawa | ................... | 327/589 |
| 6,670,828 B2 * | 12/2003 | Ramaswamy | ............... | 326/83 |
| 2004/0052146 A1 * | 3/2004 | Sim | ....................... | 365/230.03 |
| 2006/0012400 A1 * | 1/2006 | Sugawara | .................. | 326/121 |

* cited by examiner

*Primary Examiner*—Anh Phung
*Assistant Examiner*—Dang Nguyen
(74) *Attorney, Agent, or Firm*—Farjami & Farjami LLP

(57) ABSTRACT

According to one exemplary embodiment, a memory array includes a number of bitlines. The memory array further includes a voltage supply circuit, where the voltage supply circuit is configured to receive an operating voltage and a control signal and to output a low output voltage in a switching mode and a high output voltage in a programming mode. The low output voltage can be approximately equal to the operating voltage in the switching mode. In the programming mode, the high output voltage is greater than the operating voltage. According to this exemplary embodiment, the voltage supply circuit is in the programming mode when one of the bitlines is selected for programming. The voltage supply circuit is in the switching mode if none of the bitlines is selected for programming. The high output voltage can cause a bitline programming voltage to be applied to a selected bitline in the programming mode.

17 Claims, 3 Drawing Sheets

VOLTAGE SUPPLY CIRCUIT FOR MEMORY ARRAY PROGRAMMING

TECHNICAL FIELD

The present invention is generally in the field of semiconductor devices. More particularly, the present invention is in the field of memory arrays.

BACKGROUND ART

A memory array, such as a flash memory array, includes bitlines, wordlines, which run in a direction perpendicular to the bitlines, and memory cells, which are situated at the intersection of each wordline and bitline. To program a memory cell, which is situated at the intersection of a wordline and a bitline, wordline and bitline programming voltages must be applied to the respective wordline and bitline. In a memory array, such as a flash memory array, a bitline select transistor must typically be turned on for the bitline programming voltage to be applied to a selected bitline. In the memory array, a bitline select driver circuit typically provides the high output voltage required to turn on the bitline select transistor.

However, to provide the high output voltage required to turn on the bitline select transistor, the conventional bitline select driver utilizes a correspondingly high supply voltage. As a result of the high supply voltage, the conventional bitline select driver circuit requires a snap back protection transistor, which undesirably increases layout size. Also, the high supply voltage undesirably reduces the switching speed of the conventional bitline select driver circuit.

Thus, there is a need in the art for reduced layout size and increased switching speed in a bitline select driver circuit in a memory array, such as a flash memory array.

SUMMARY

The present invention is directed to a voltage supply circuit for memory array programming. The present invention addresses and resolves the need in the art for reduced layout size and increased switching speed in a bitline select driver circuit in a memory array, such as a flash memory array.

According to one exemplary embodiment, a memory array includes a number of bitlines. The memory array can be, for example, a flash memory array. The memory array further includes a voltage supply circuit, where the voltage supply circuit is configured to receive an operating voltage and a control signal and to output a low output voltage in a switching mode and a high output voltage in a programming mode. The low output voltage can be approximately equal to the operating voltage in the switching mode. In the programming mode, the high output voltage is greater than the operating voltage. The voltage supply circuit can switch between the switching mode and the programming mode in a time of between approximately 10.0 nanoseconds and approximately 20.0 nanoseconds, for example.

According to this exemplary embodiment, the voltage supply circuit is in the programming mode when one of the bitlines is selected for programming. The voltage supply circuit can be in the switching mode if none of the bitlines is selected for programming. The high output voltage can cause a bitline programming voltage to be applied to a selected bitline in the programming mode. The memory array further includes a bitline select driver circuit, where the bitline select driver circuit can be configured to receive the high output voltage from the voltage supply circuit and cause the bitline programming voltage to be applied to the selected bitline, and where the bitline select driver circuit does not require a snap back protection transistor. Other features and advantages of the present invention will become more readily apparent to those of ordinary skill in the art after reviewing the following detailed description and accompanying drawings.

DETAILED DESCRIPTION OF THE INVENTION

Figure 1:
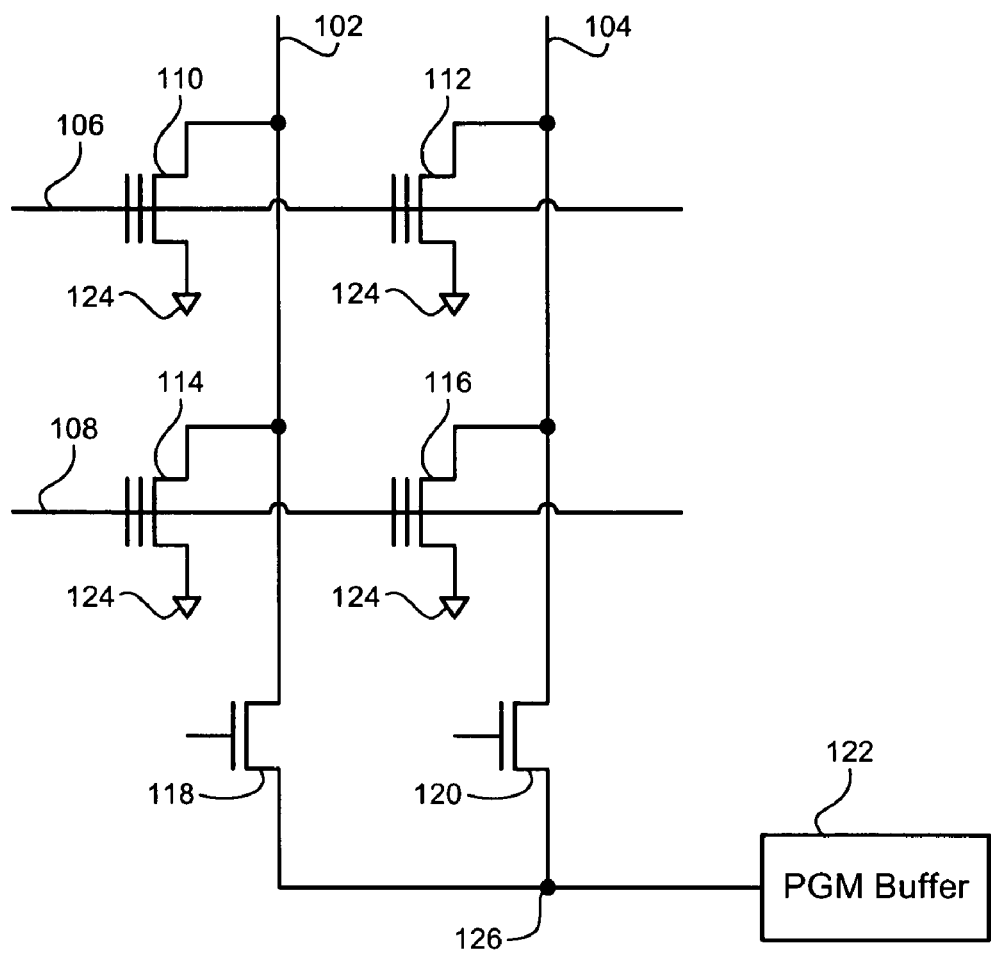
FIG. 1 illustrates a circuit diagram of an exemplary memory array in accordance with one embodiment of the present invention.

The present invention is directed to a voltage supply circuit for memory array programming. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

In the present application, a flash memory array is utilized to illustrate the present invention, which provides a voltage supply circuit that provides a low output voltage in a switching mode and a high output voltage in a programming mode. However, the present invention can also be applied to other types of memory arrays as well as other applications that require a voltage supply circuit that provides fast switching between a low output voltage and a high output voltage.

FIG. 1 shows a circuit diagram of an exemplary memory array in accordance with one embodiment of the present invention. Memory array 100 includes bitlines 102 and 104, wordlines 106 and 108, memory cells 110, 112, 114, and 116, bitline select transistors 118 and 120, and program mode (PGM) buffer 122. Memory array 100 can be a non-volatile memory array, such as a flash memory array, or other type of memory array other than a non-volatile memory array. It is noted that although only bitlines 102 and 104, wordlines 106 and 108, memory cells 110, 112, 114, and 116, and bitline select transistors 114 and 116 are described herein to preserve brevity, memory array 100 can include a large number of bitlines, wordlines, memory cells, and bitline select transistors.

As shown in FIG. 1, the drain terminals of memory cells 110 and 112 are connected to respective bitlines 102 and 104, the gate terminals of memory cells 110 and 112 are connected to wordline 106, and the source terminals of memory cells 110 and 112 are connected to ground 124. Also shown in FIG. 1, the drain terminals of memory cells 114 and 116 are connected to respective bitlines 102 and 104, the gate terminals of memory cells 114 and 116 are connected to wordline 108, and the source terminals of memory cells 114 and 116 are connected to ground 124. Further shown in FIG. 1, the drain terminals of bitline select transistors 118 and 120 are connected to the output of PGM buffer 122 at node 126 and the source terminals of bitline select transistors 118 and 120 are connected to respective bitlines 102 and 104. Bitline select transistors 118 and 120 can be N-channel field effect transistors (NFETs). PGM buffer 122 provides an appropriate bitline programming voltage. For example, PGM buffer 122 may provide a bitline programming voltage of approximately 5.0 volts.

To program a memory cell, such as memory cell 114, in memory array 100, a wordline programming voltage, which can be, for example, of approximately 10.0 volts, can be applied to wordline 108 and a bitline programming voltage, which can be, for example, approximately 5.0 volts, can be applied to bitline 102. In memory array 110, a sufficiently high voltage can be applied to the gate terminal of bitline select transistor 118 to turn on bitline select transistor 118 and, thereby, couple the programming voltage provided by PGM buffer 122 to bitline 102. For example, a voltage of at least 9.0 volts may be applied to the gate terminal of bitline select transistor 118 to turn on bitline select transistor 118. The high voltage required to turn on a bitline select transistor, such as bitline select transistor 118, can be provided by the present invention's voltage supply circuit, which is discussed below in relation to FIG. 2.

Figure 2:
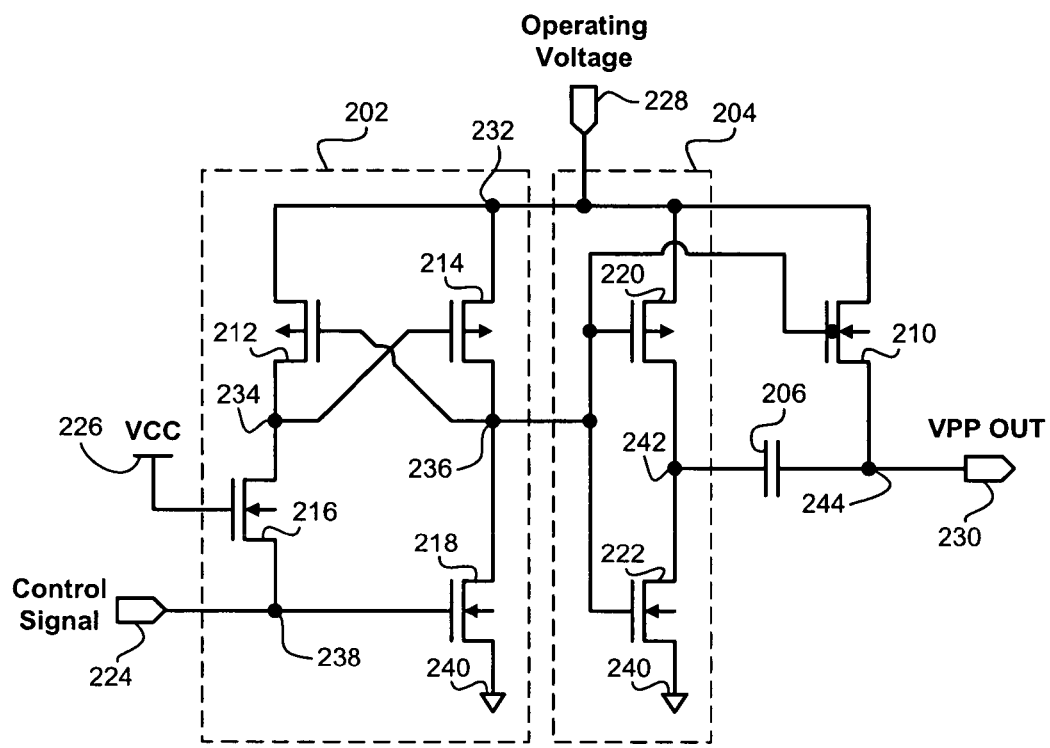
FIG. 2 illustrates a circuit diagram of an exemplary voltage supply circuit in accordance with one embodiment of the present invention.

FIG. 2 shows a circuit diagram of an exemplary voltage supply circuit in accordance with one embodiment of the present invention. Voltage supply circuit 200 includes level shifter 202, driver circuit 204, capacitor 206, and transistor 210. Level shifter 202 includes transistors 212, 214, 216, and 218, and driver circuit 204 includes transistors 220 and 222. Voltage supply circuit 200 can be configured to receive control signal 224, chip supply voltage 226 (i.e. VCC), and operating voltage 228, and to provide a low output voltage at VPP output (VPP OUT) 230 in a switching mode and to provide a high output voltage at VPP OUT 230 in a programming mode.

As shown in FIG. 2, the source terminals of transistors 212 and 214 are connected to operating voltage 228 at node 232, the gate terminal of transistor 214 is connected to the drain terminal of transistor 212 at node 234 and 212, and the gate terminal of transistor 212 is connected to the drain terminal of transistor 214 at node 236, which is also an output of level shifter 202. The transistors 212 and 214 can be P-channel field effect transistors (PFETs), such as enhancement-mode PFETs. In the present embodiment, operating voltage 228, which can be, for example, approximately 5.0 volts, can be provided by a regulator (not shown in FIG. 2), which can have an input coupled to an output of a charge pump (not shown in FIG. 2). The charge pump (not shown in FIG. 2) can receive chip supply voltage 226 (i.e. VCC) and provide an output voltage of approximately 8.0 volts, for example, to the regulator (not shown in FIG. 2). In other embodiments, operating voltage 228 may be provided without using the combination of a charge pump and a regulator.

Also shown in FIG. 2, control signal 224 is connected to the gate terminal of transistor 218 and the source terminal of transistor 216 at node 238 (i.e. an input of level shifter 202), the gate terminal of transistor 216 is connected to chip supply voltage 226, the drain terminals of transistors 216 and 218 are connected to respective nodes, 234 and 236, and the source terminal of transistor 218 is connected to ground 240. Transistors 216 and 218 can be NFETs, such as enhancement-mode NFETs, for example. Chip supply voltage 226 (i.e. VCC) can be approximately 1.8 volts, for example. In other embodiments, chip supply voltage 226 may be less than or greater than 1.8 volts. However, chip supply voltage 226 is less than operating voltage 228. Control signal 224 can be configured to provide a high voltage level, which is approximately equal to chip supply voltage 226 (i.e. VCC), to cause voltage supply circuit 200 to be in a programming mode and to provide a low voltage level, which is approximately equal to 0.0 volts, to cause voltage supply circuit 200 to be in a switching mode. Thus, control signal 224 has a maximum voltage level that is less than operating voltage 228.

Further shown in FIG. 2, the gate terminals of transistors 210, 220, and 222 are connected to node 236, the drain terminals of transistors 220 and 222 are connected to a first terminal of capacitor 206 at node 242, the drain terminal of transistor 210 and the source terminal of transistor 220 are connected to node 232, and the source terminal of transistor 210 is connected to a second terminal of capacitor 206 at node 244, which also provides VPP OUT 230. Transistor 220 can be a PFET, such as an enhancement-mode PFET, and transistor 222 can be an NFET, such as an enhancement-mode NFET, for example. Capacitor 206 may have a value of between 30.0 picofarads and 40.0 picofarads, for example. Transistor 210 can be an NFET, such as a "normally on" NFET.

The operation of voltage supply circuit 200 will now be discussed. Voltage supply circuit 200 operates in a switching mode when control signal 224 is at a low voltage level and operates in a programming mode when control signal 224 is at a high voltage level. In the switching mode, control signal 224, which is at a low voltage level (i.e. approximately equal to 0.0 volts), causes transistor 218 to turn off, which causes transistor 220 to turn off and transistors 210 and 222 to turn on. As a result, operating voltage 228, which can be approximately 5.0 volts, is provided at node 244 via transistor 210. Thus, in the switching mode, a low output voltage that is approximately equal to operating voltage 228 is provided at VPP OUT 230.

In the programming mode, control signal 224, which is at a high voltage level (i.e. approximately equal to VCC), causes transistor 218 to turn on, which pulls down node 236 and causes transistor 220 to turn on and transistors 210 and 222 to turn off. As a result, node 242, which drives capacitor 206, goes high (e.g. to the approximate voltage level of operating voltage 228), which causes capacitor 206 to provide approximately 10.0 volts at node 244. Thus, in the programming mode, a high output voltage, which is equal to approximately 10.0 volts, is provided at VPP OUT 230.

Figure 3:
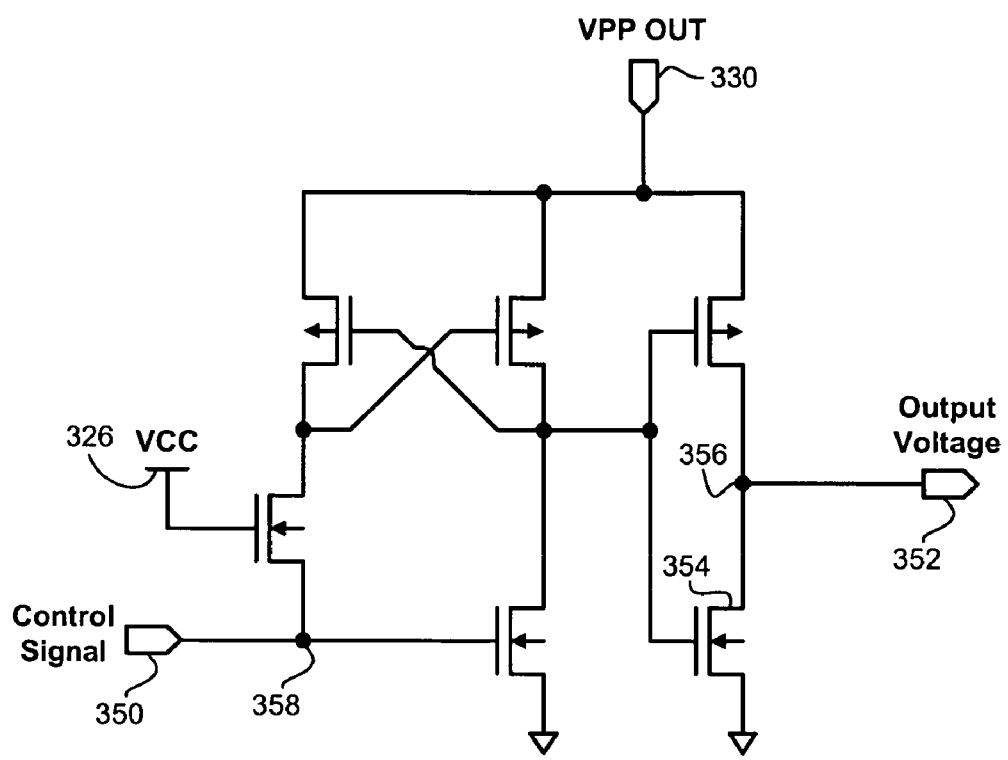
FIG. 3 illustrates a circuit diagram of an exemplary bitline select driver circuit in accordance with one embodiment of the present invention.

In the programming mode, the high output voltage provided by voltage supply circuit 200 can be coupled to the gate terminal of a selected bitline select transistor in memory array 100 via a bitline select driver circuit, which will be discussed below in relation to FIG. 3. In the switching mode, the low output voltage provide by voltage supply circuit 200 can be provided to the bitline select driver circuit when none of the bitlines in memory array 100 has been selected for programming (e.g. in the interval between the programming of one bitline and the programming of the next bitline). Additionally, voltage supply circuit 200 can quickly switch from the programming mode to the switching mode and vice versa. By way of example, voltage supply circuit 200 can switch between the programming mode and switching mode or vice versa in a time of between approximately 10.0 nanoseconds and approximately 20.0 nanoseconds FIG. 3 shows a circuit diagram of an exemplary bitline select driver circuit in accordance with one embodiment of the present invention. In FIG. 3, chip supply voltage 326 and VPP OUT 330 correspond, respectively, to chip supply voltage 226 and VPP OUT 230 in FIG. 2. Bitline select driver circuit 300 can be configured to receive chip supply voltage 326, VPP OUT 330 (from voltage supply circuit 200), and control signal 350, and provide output voltage 352 at node 356. Output voltage 352 can be coupled to the gate terminal of a bitline select transistor, such as bitline select transistor 118, in memory array 100 in FIG. 1.

The operation of bitline select driver circuit 300 will now be discussed. To select a bitline associated with bitline select driver circuit 300 for programming, control signal 350 provides an appropriate voltage level at node 358 so as to cause output voltage 352 at node 356 to be approximately equal to VPP OUT 330. Output voltage 352 is coupled to the gate terminal of the bitline select transistor that is coupled to the selected bitline. When the bitline has been selected, voltage supply circuit 200 switches VPP OUT 330 from a low output voltage to a high output voltage, which causes the select transistor to connect a bitline programming voltage to the selected bitline for programming. After the selected bitline has been programmed, voltage control circuit 200 switches VPP OUT 330 from a high output voltage to a low output voltage, which is approximately equal to operating voltage 228 in FIG. 2.

Since VPP OUT 330 switches from a high output voltage to a low output voltage, a snap back protection transistor is not required in bitline select driver circuit 300. For example, a snap back protection transistor is not required between node 356 and the drain terminal of transistor 354 of bitline select driver circuit 300. In contrast, since the operating voltage is a conventional bitline select driver circuit is approximately equal to the high output voltage provided by the conventional bitline select driver circuit, the conventional bitline select driver circuit requires a snap back protection transistor, which undesirably increases layout size. Thus, by providing a low voltage output in a switching mode and a high voltage output in a programming mode, the present invention's voltage supply circuit eliminates the need for a snap back protection transistor in the bitline select driver circuit and, thereby, reduces the layout size of the bitline select driver circuit. Also, by providing a low voltage output to the bitline select driver circuit in a switching mode, the present invention increases the switching speed of the bitline select driver circuit.

Thus, as discussed above, by providing a voltage supply circuit that provides a low output voltage in a switching mode and a high output voltage in a programming mode, the present invention advantageously reduces layout size of a bitline select driver circuit in a memory array, such as a flash memory array. Additionally, the present invention advantageously provides a voltage supply circuit having a fast switching speed from a high output voltage to a low output voltage and vice versa. Furthermore, since the low output voltage of the invention's voltage supply circuit is coupled to the bitline select driver circuit in the switching mode, the present invention advantageously increases the switching speed of the bitline select driver circuit.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a voltage supply circuit for memory array programming has been described.

The invention claimed is:

1. A memory array comprising:
   a plurality of bitlines;
   a voltage supply circuit, said voltage supply circuit being configured to receive an operating voltage and a control signal and to output a low output voltage in a switching mode and a high output voltage in a programming mode;
   wherein said voltage supply circuit is in said programming mode when one of said plurality of bitlines is selected for programming;
   wherein said high output voltage causes a bitline programming voltage to be applied to a selected one of said plurality of bitlines in said programming mode;
   a bitline select driver circuit, wherein said bitline select driver circuit is configured to receive said high output voltage from said voltage supply circuit and cause said bitline programming voltage to be applied to said selected one of said plurality of bitlines, wherein said bitline select driver circuit does not require a snap back protection transistor.

2. The memory array of claim 1 wherein said voltage supply circuit is in said switching mode if none of said plurality of bitlines is selected for programming.

3. The memory array of claim 1 wherein said low output voltage is approximately equal to said operating voltage in said switching mode.

4. The memory array of claim 1 wherein said high output voltage is greater than said operating voltage in said programming mode.

5. The memory array of claim 1 wherein said control signal causes said voltage supply circuit to switch between said switching mode and said programming mode, wherein said control signal has a maximum voltage level that is less than said operating voltage.

6. The memory array of claim 1 wherein said voltage supply circuit can switch between said switching mode and said programming mode in a time of between approximately 10.0 nanoseconds and approximately 20.0 nanoseconds.

7. The memory array of claim 5 wherein said maximum voltage level of said control signal is approximately equal to 1.8 volts.

8. The memory array of claim 1 wherein said memory array is a flash memory array.

9. A memory array comprising:
   a plurality of bitlines;
   a voltage supply circuit, said voltage supply circuit being configured to receive an operating voltage and a control signal and to output a low output voltage in a switching mode and a high output voltage in a programming mode, said control signal causing said voltage supply circuit to output said low output voltage in said switching mode and to output said high output voltage in said programming mode;

wherein said voltage supply circuit is in said programming mode when one of said plurality of bitlines is selected for programming, and wherein said voltage supply circuit is in said switching mode if none of said plurality of bitlines is selected for programming;

wherein said voltage supply circuit comprises a driver circuit connected to a first terminal of a capacitor at a first node, wherein a second terminal of said capacitor is connected to a second node, wherein said operating voltage is provided at first node and said high output voltage is provided at said second node when said voltage supply circuit is in said programming mode.

10. The memory array of claim 9 wherein said low output voltage is approximately equal to said operating voltage in said switching mode.

11. The memory array of claim 9 wherein said high output voltage is greater than said operating voltage in said programming mode.

12. The memory array of claim 9 wherein said high output voltage causes a bitline programming voltage to be applied to a selected one of said plurality of bitlines.

13. The memory array of claim 9 wherein said voltage supply circuit further comprises a level shifter, wherein said level shifter has an output connected to an input of said driver circuit at a third node and an input connected to said control signal.

14. The memory array of claim 9 wherein said voltage supply circuit further comprises a normally on FET having a drain terminal connected to said operating voltage and a source terminal connected to said second node, wherein said normally on FET is configured to provide said low output voltage at said second node in said switching mode.

15. The memory array of claim 12 further comprising a bitline select driver circuit, wherein said bitline select driver circuit is configured to receive said high output voltage from said voltage supply circuit and cause said bitline programming voltage to be applied to said selected one of said plurality of bitlines, wherein said bitline select driver circuit does not require a snap back protection transistor.

16. The memory array of claim 9 wherein said voltage supply circuit can switch between said switching mode and said programming mode in a time of between approximately 10.0 nanoseconds and approximately 20.0 nanoseconds.

17. The memory array of claim 9 wherein said memory array is a flash memory array.

* * * * *